May 4, 1971 J. F. NORWICH ET AL 3,577,287
ALUMINUM DIFFUSION TECHNIQUE
Filed Feb. 12, 1968
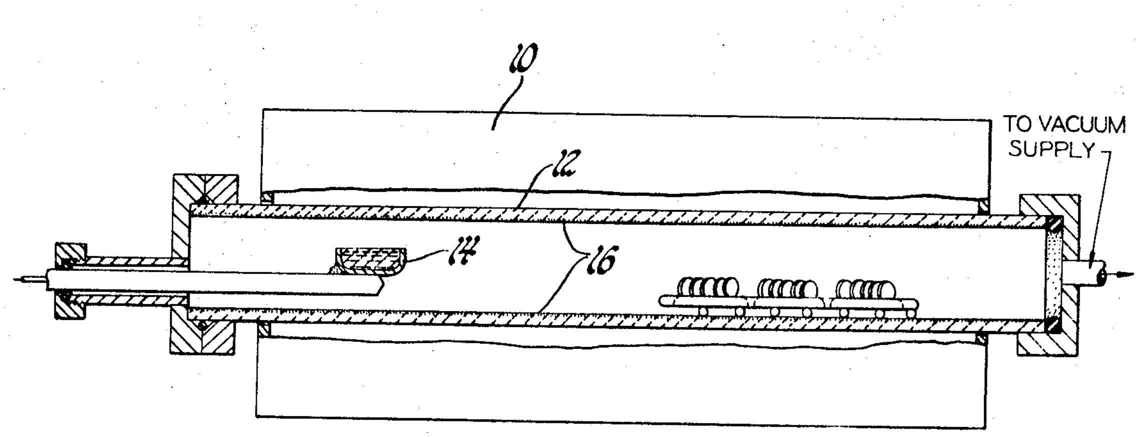
INVENTORS
John F. Norwich, &
Edward J. Roesener, Jr.
BY E. J. Wallace
ATTORNEY United States Patent Office 3,577,287

Patented May 4, 1971

3,577,287

ALUMINUM DIFFUSION TECHNIQUE

John F. Norwich and Edward J. Roesener, Jr., Kokomo, Ind., assignors to General Motors Corporation, Detroit, Mich.

Filed Feb. 12, 1968, Ser. No. 704,676
Int. Cl. H01l 7/44
U.S. Cl. 148—189 5 Claims

ABSTRACT OF THE DISCLOSURE

A technique for producing an improved aluminum diffusion region in a silicon surface adjacent a surface region that is heavily doped with an N-type impurity such as phosphorus. Improved rectifying junctions sustaining higher back voltages and having lower forward voltage drop and lower reverse current leakage are produced by simultaneously exposing said silicon surface to a P-type impurity such as boorn, during the aluminum diffusion. A pretreatment of a diffusion furnace tube with boron and aluminum is also described.

BACKGROUND OF THE INVENTION

This invention concerns a new diffusion technique for producing improved high back voltage junctions. More particularly, it concerns an improved technique for producing high voltage silicon rectifiers having a relatively low forward voltage drop and relatively low reverse current leakage. For optimum characteristics in a high voltage silicon rectifier, extremely high surface concentrations are desired in the adjacent N-type and P-type regions forming the rectifier. For some rectifiers the P-type surface is produced by vapor diffusion of aluminum and the N-type surface by an impurity such as phosphorus. We have found that the maximum benefits available from a diffused aluminum junction are not in fact realized when the aluminum diffused region is produced adjacent a highly doped N-type surface having an impurity such as phosphorus. We have found that the N-type impurity has a compensating effect on the aluminum which lowers the maximum back voltage the aluminum junction can satisfactorily sustain.

We believe that this compensation occurs due to an out-diffusion of the N-type impurity from the in situ-formed oxide coating which supposedly isolates the N-type region. The impurity then migrates over to the aluminum diffusion region to reduce its effective aluminum surface concentration. This frequently results in patches of, sometimes an entire, surface skin on the aluminum diffused region being actually N-type. Thicker oxide coatings formed in situ on the N-type region do not significantly alleviate the effect, and use of evaporated oxide coatings, particularly of larger thickness, present other problems.

In any event, we have found that we can inhibit this compensating effect which we have discovered, and realize the full aluminum junction potential, by using an improved aluminum diffusion techniqe.

SUMMARY OF THE INVENTION

It is, therefore, an object of this invention to provide an improved alminum diffusion technique for producing P-type regions in silicon surfaces having adjacent N-type regions with high surface concentrations of an N-type impurity.

Another object of the invention is to provide a method of producing unusually high uncompensated aluminum surface concentrations on one major surface of a silicon slice even though the opposite surface of that slice has a high surface concentration of N-type impurity.

A further object of the invention is to provide an improved all-diffused aluminum-phosphorus high voltage rectifier.

A still further object of the invention is to provide an improved commercial production technique for producing an uncompensated aluminum diffusion region in a silicon surface region having adjacent regions with a high surface concentration of an N-type impurity.

Also, an object of the invention is to provide an improved apparatus for the commercial production of uncompensated aluminum junctions in silicon surfaces adjacent regions having a high surface concentration of N-type impurity.

These and other objects of the invention are accomplished by diffusing aluminum vapor into the silicon surface region while said surface is concurrently exposed to a boron vapor. A preferred technique which is particularly successful involves pretreating the furnace tube of a conventional diffusion furnace prior to its use for aluminum diffusion to completely react the inner surface of the tube with aluminum vapor and impregnate it with a boron. The aluminum diffusion is then carried out in a conventional manner with an aluminum source at one end of the tube providing a source of aluminum for the diffusion, and the previously boron treated furnace tube providing a source of boron. Quartz diffusion substrate holders are also pretreated with aluminum vapor for optimum results.

BRIEF DESCRIPTION OF THE DRAWING

Other objects, features and advantages of the invention will become more apparent from the following description of preferred examples thereof and from the drawing which schematically shows a typical diffusion furnace such as can be used to accomplish the objects of this invention, with the inner surface of the furnace tube pretreated with boron and aluminum.

DESCRIPTION OF THE PREFERRED EMBODIMENTS

By means of our invention we have been able to consistently achieve silicon rectifiers having aluminum junctions capable of withstanding higher back voltages, with lower reverse current leakage and forward voltage drop than previously obtainable. In an all-diffused silicon rectifier, in which the N-type surface is established by vapor diffused phosphorus, this improved aluminum diffusion technique is particularly useful.

Moreover, in our preferred technique we have even found how we can increase the yields of such improved devices. In our preferred technique, we pretreat a conventional mullite furnace tube with both boron and aluminum to produce the unexpected improvement. As can be seen in the drawing our improved aluminum diffusion technique is carried out in a conventional diffusion furnace having a heat source (not shown) within a jacket 10 surrounding an elongated mullite furnace tube 12, which is adapted to be evacuated. The furnace tube contains a small alumina crucible 14 containing aluminum metal, serving as a source of aluminum vapor during the aluminum diffusion. A plurality of silicon slices, each of which has a high surface concentration of phosphorus on one major surface thereof are situated along the length of the tube on quartz supports. The slices are spaced from the aluminum vapor source in the normal and accepted manner to minimize variation in aluminum diffusion effects due to relative distance of the slices from the aluminum source. As shown, the inner surface 16 of the furnace tube 12 has been pretreated with boron and aluminum.

The tube 12 is the usual mullite tube, as for example mullite MV30, which is about 63% aluminum oxide and 37% silicon dioxide, by weight. It is about 64 inches long and has an inner diameter of about 2⅝ inches and a wall thickness of about 1/16 inch. It is pretreated by subjecting it to a plurality of alternate aluminum diffusion runs (without diffusion substrates present) and intervening exposures to oxygen, by exposing it several times to boron vapor. Once the furnace tube is pretreated with aluminum, it need not be retreated again with aluminum throughout its useful life. On the other hand, the tube should be retreated with boron after every several aluminum diffusions if optimum results are to be obtained. The aluminum pretreatment need not be repeated because whatever effect is initially produced is reinforced during each aluminum diffusion run made with the tube. This is not true with respect to the boron pretreatment.

We have found that the untreated furnace tube absorbs or reacts with aluminum vapor at the usual diffusion temperatures, lowering the aluminum vapor pressure along the length of the tube, which in turn lowers the surface concentration of the aluminum diffused into slices progressively located along the length of the tube. However, we have found that we can satisfy the tube's acceptance of aluminum before the tube is ever used to diffuse aluminum into the silicon slices. We do so by making a plurality of diffusion runs with the tube, without any slices in the tube, and between each run exposing the tube to the atmosphere before it is allowed to cool. The preferred air exposure is about as long in duration as the aluminum diffusion. It appears that after 10 to 12 cycles of deposition and oxidation the tube no longer will accept aluminum. It is at this point we refer to it an non-reactive with aluminum vapor. Fewer cycles will make the tube less reactive, but we prefer to make it substantially non-reactive. Also, it is to be appreciated that the pretreatment cycles might be altered to either increase or decrease the number of them required to make the tubes non-reactive. In any event, after this treatment the inner surface of the tube no longer accepts any appreciable amount of aluminum. Thus, it will not induce any abnormal aluminum vapor pressure drop along the length of the tube, producing a higher aluminum surface concentration in the slices to be obtained and permitting a greater number of higher surface concentration slices to be processed in the tube at one time.

A particular pretreatment cycle for the mullite tube previously described would involve subjecting the tube interior to 12 successive one-half hour exposures to aluminum vapor at 1200° C., from a source within the tube at about 1180° C., allowing one-half hour exposures to air between each deposition. Quartz and alumina slice holders should be inserted in the tube for three aluminum depositions.

It should be noted that it can easily be determined when any mullite tube has been sufficiently pretreated with aluminum by comparing the aluminum surface concentrations of test slices identically located along the length of the tube on successive identical diffusion runs. If there is little deviation in identically located slices, particularly those furthest away from the aluminum source, the tube has been sufficiently pretreated.

Incidentally, quartz and alumina, if used for diffusion substrate holders should also be pretreated with aluminum. This can be done by simply inserting the substrate holders in the mullite tube when the tube is pretreated. However, the substrate holders are preferably subjected to the aluminum vapor only 3 or 4 times. They need not be treated again either.

On the other hand, the boron pretreatment provides a source of boron for the diffusion substrates during the aluminum diffusion. No separate source of boron is used. Hence, the effect of the boron pretreatment will gradually diminish over a number of diffusion runs. To insure maximum effect from the pretreatment and obtain maximum blocking of the compensating effect of the N-type impurity, we prefer to retreat the mullite tube with boron after each several diffusion runs.

The tube can be treated with boron by exposing its interior to boron metal vapor. However, it is preferably treated by placing a vaporizazable boron compound, as for example $B_2O_3$ or $BCl_3$, in the tube and heating the tube to the aluminum diffusion temperature. Hence when we refer to boron impregnation and boron diffusion, we mean to include both boron metal and boron compounds as a source of boron.

The boron compound can be placed in an alumina boat for evaporation, but we prefer to coat a plurality of silicon slices with the compound, space them uniformly in the diffusion zone and allow the compound to evaporate from their surfaces to more uniformly treat the tube. Moreover, by this latter technique, one can better control the treatment to avoid overdoping the tube. If the tube is excessively doped with boron, we notice a reduction in the high voltage characteristics of rectifiers made. Apparently, an excess of boron can mask the effects of the aluminum diffusion and/or even compensate the N-type surface itself. Hence, the tube should be doped, impregnated, with sufficient boron to inhibit the compensating effect of the N-type impurity but less than that which will mask the desired effect of the aluminum diffusion or compensate the adjacent N-type conductivity surface. As boron doping of the tube is increased, the effective surface concentration of aluminum in diffused slices, measured as surface conductivity, increases to an optimum and then diminishes as the tube becomes excessively doped with boron. It appears that optimum surface conductivity, or resistivity, of the aluminum diffused region is achieved with tube dopings that induce a boron surface concentration greater than $5\times10^{16}$ atoms per cc. and preferably approximately $1\times10^{18}$ to $1\times10^{19}$ atoms per cc. Boron surface concentrations as high as $1\times10^{20}$ atoms per cc. appear to be objectionable.

Even though we diffuse boron and aluminum concurrently, we still refer to our technique as an aluminum diffusion process. Boron does not diffuse as fast as aluminum, so that the depth of the diffusion region is determined by aluminum. The surface concentration of boron preferred appears to be only that sufficient to negate any reduction in effective aluminum surface concentration by N-type impurities coming from the adjacent N-type region. Hence, we realize the full benefit of the aluminum diffusion.

The boron can be introduced into the diffusion system from a source other than the tube. For example, a separate crucible of a boron salt can be provided in the system during the aluminum diffusion. However, use of such a boron source makes control of the boron surface concentration in the aluminum diffused region more difficult and decreases uniformity in boron surface concentration in slices along the length of the tube. For these reasons we prefer to use the tube as the boron source.

In our preferred process, we then need only perform a conventional aluminum vapor diffusion once the furnace tube has been pretreated in accordance with our invention. N-type silicon slices are placed in the tube preferably in pairs with the high concentration N-type surfaces placed back to back. The slices, for example, may be of high resistivity N-type silicon with one major surface having phosphorus vapor diffused into it to provide a surface concentration at least about $1\times10^{20}$. The tube is then closed, and evacuated while it is being heated to an elevated temperature. The diffusion zone, where the slices are located, is raised to a temperature of 1200° C. while the source zone temperature is being raised to about 1180° C. When the desired temperatures are achieved the aluminum source is moved into the source zone to initiate aluminum deposition and diffusion. After about one-half hour, the source is removed from the hot zone, the tube back filled with air, and the slices are slowly cooled in the normal and accepted manner. When sufficiently cool, the slices are removed from the tube.

Thus, the pretreatment of the furnace tube decreases the loss of aluminum vapor to the tube during the course of the aluminum diffusion. It also provides an especially satisfactory source of boron to inhibit compensation of the aluminum diffusion surface. It even removes any undesirable volatile tube impurities which might vaporize during an aluminum diffusion and deposit on slices being treated.

It is to be understood that although this invention has been described in connection with certain specific examples thereof, no limitation is intended thereby except as defined in the appended claims.

We claim:

1. An improved method for diffusing aluminum into a silicon surface adjacent at least one N-type surface region having a high surface concentration N-type impurity to improve the effect of the aluminum diffusion and to increase the uniformity of such improved diffusions along the length of a diffusion furnace tube, said method comprising the steps of alternately exposing the interior of a mullite diffusion furnace tube to aluminum vapor and oxygen at an elevated temperature a plurality of times until said tube interior no longer significantly accepts aluminum vapor, exposing said tube to boron vapor, thereafter placing a plurality of silicon slices along the length of said tube, at least one of said slices having a major surface of N-type conductivity with a high surface concentration of N-type impurity, and diffusing aluminum from a separate source within said tube into exposed surface regions of said slices.

2. The method as defined in claim 1 wherein the N-type impurity is a volatile impurity such as phosphorus, the surface concentration of said N-type impurity is at least $1\times10^{20}$ atoms per cubic centimeter, and the boron treated furnace tube induces a boron surface concentration in said exposed slice surfaces of about $5\times10^{16}$ to $1\times10^{20}$ atoms per cubic centimeter.

3. The method as defined in claim 2 wherein the boron surface concentration induced in the exposed slice surfaces is about $1\times10^{18}$–$1\times10^{19}$.

4. A method for obtaining an improved high back voltage aluminum diffusion junction in a region of a high resistivity silicon surface adjacent at least one silicon oxide coated N-type surface region having a high surface concentration of at least about $1\times10^{20}$ atoms per cubic centimeter, said method comprising the steps of reacting the inner surface of a diffusion furnace tube with aluminum vapor before the furnace tube is used for an aluminum diffusion treatment until said tube substantially ceases to react with said vapor, providing a discrete source of aluminum vapor within the reacted tube, then placing at least one silicon slice having said N-type surface region within said tube, and diffusing aluminum from said discrete source into said silicon surface within said reacted tube, and concurrently diffusing boron into said silicon surface to inhibit the compensating effect of N-type impurity out-diffusion from said adjacent high surface concentration N-type region.

5. An improved method for diffusing aluminum into a silicon surface adjacent at least one N-type surface region having a high surface concentration of N-type impurity to improve the effect of the aluminum diffusion and to increase the uniformity of such improved diffusions along the length of a diffusion furnace tube, said method comprising the steps of alternately exposing the interior of a mullite diffusion furnace tube to a vapor consisting essentially of aluminum and oxygen at an elevated temperature for a period of time until said tube interior no longer significantly accepts aluminum vapor, thereafter placing a pluarlity of silicon slices along the length of said tube, at least one of said slices having a major surface of N-type conductivity with a high surface concentration of N-type impurity, diffusing aluminum from a discrete source within said tube into exposed surface regions of said slices, and concurrently diffusing boron into said silicon surface to inhibit the compensating effect of N-type impurity out-diffusion from said adjacent high surface concentration N-type region.

References Cited

UNITED STATES PATENTS

| | | | |
|---|---|---|---|
| 2,861,018 | 11/1958 | Fuller et al. | 148—189 |
| 3,205,102 | 9/1965 | McCaldin | 148—189 |
| 3,215,570 | 11/1965 | Andrews et al. | 148—187 |
| 3,314,833 | 4/1967 | Arndt et al. | 148—189 |
| 3,362,858 | 1/1968 | Knofp | 148—189X |
| 3,391,035 | 7/1968 | Mackintosh | 148—189X |
| 3,445,302 | 5/1969 | Lepiane | 148—190X |

FOREIGN PATENTS

| | | | |
|---|---|---|---|
| 895,769 | 5/1962 | Great Britain | 23—191 |

ALLEN B. CURTIS, Primary Examiner

U.S. Cl. X.R.

148—190; 317—235